(12) United States Patent
Tanaka

(10) Patent No.: US 11,792,965 B2
(45) Date of Patent: Oct. 17, 2023

(54) IMAGE DISPLAY DEVICE

(71) Applicant: SHARP KABUSHIKI KAISHA, Sakai (JP)

(72) Inventor: Kengo Tanaka, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 17/547,159

(22) Filed: Dec. 9, 2021

(65) Prior Publication Data

US 2022/0192061 A1 Jun. 16, 2022

(30) Foreign Application Priority Data

Dec. 10, 2020 (JP) .................................. 2020-204879
Nov. 9, 2021 (JP) .................................. 2021-182706

(51) Int. Cl.
*H05K 7/20* (2006.01)
*H05K 1/02* (2006.01)

(52) U.S. Cl.
CPC ....... *H05K 7/20963* (2013.01); *H05K 1/0209* (2013.01); *H05K 2201/10128* (2013.01)

(58) Field of Classification Search
CPC ............. H05K 7/20963; H05K 1/0209; H05K 2201/10128
See application file for complete search history.

(56) References Cited

U.S. PATENT DOCUMENTS

| | | | |
|---|---|---|---|
| 2005/0088097 A1 | 4/2005 | Bae et al. | |
| 2010/0013416 A1 | 1/2010 | Fukui | |
| 2014/0085866 A1* | 3/2014 | Shirai | F21V 33/0052 362/382 |
| 2021/0165469 A1 | 6/2021 | Kazama et al. | |
| 2022/0320458 A1* | 10/2022 | Chang | H01L 27/3225 |

FOREIGN PATENT DOCUMENTS

| | | |
|---|---|---|
| JP | 2005128554 A | 5/2005 |
| JP | 2008299054 A | 12/2008 |
| JP | 2019086548 A | 6/2019 |
| KR | 20050051035 A | 6/2005 |
| WO | 2008102534 A1 | 8/2008 |
| WO | 2020/017210 A1 | 1/2020 |

* cited by examiner

*Primary Examiner* — Mukundbhai G Patel
(74) *Attorney, Agent, or Firm* — ScienBiziP, P.C.

(57) ABSTRACT

An image display device includes a circuit board disposed at a position corresponding to a portion of a back surface of a display panel at a side of a back surface of an inner plate at a side of the back surface of the display panel; and a heat insulating member provided between the circuit board and the inner plate.

6 Claims, 25 Drawing Sheets

IMAGE DISPLAY DEVICE

BACKGROUND

1. Field

The present disclosure relates to an image display device including a display panel that displays an image.

2. Description of the Related Art

An image display device including a display panel that displays an image is known (the pamphlet of International Publication No. 2020/017210). The image display device includes an inner plate (back cover) disposed along a back surface of the display panel and a circuit board fixed at a position corresponding to a portion of a back surface of the inner plate.

SUMMARY

However, in the related art described above, since the circuit board is fixed to the portion of the back surface of the inner plate at the back surface of the display panel, heat radiated from the circuit board is transferred through the inner plate to a portion of the display panel overlapping the circuit board, and the temperature of the display panel locally increases. Hence, there is a problem that a temperature distribution of the back surface of the display panel becomes non-uniform.

It is desirable to provide an image display device that can make a temperature distribution of a back surface of a display panel close to being uniform.

According to an aspect of the disclosure, there is provided an image display device including a display panel that displays an image; an inner plate provided at a side of a back surface of the display panel; a circuit board disposed at a position corresponding to a portion of the back surface of the display panel at a side of a back surface of the inner plate; and a heat insulating member provided between the circuit board and the inner plate..

According to another aspect of the disclosure, there is provided an image display device including a display panel that displays an image; a circuit board disposed at a side of a back surface of the display panel, at a position corresponding to a portion of the back surface of the display panel; and a heat insulating member provided between the circuit board and the display panel.

DESCRIPTION OF THE EMBODIMENTS

First Embodiment

Hereinafter, an embodiment of the present disclosure will be described in detail.

Figure 1:
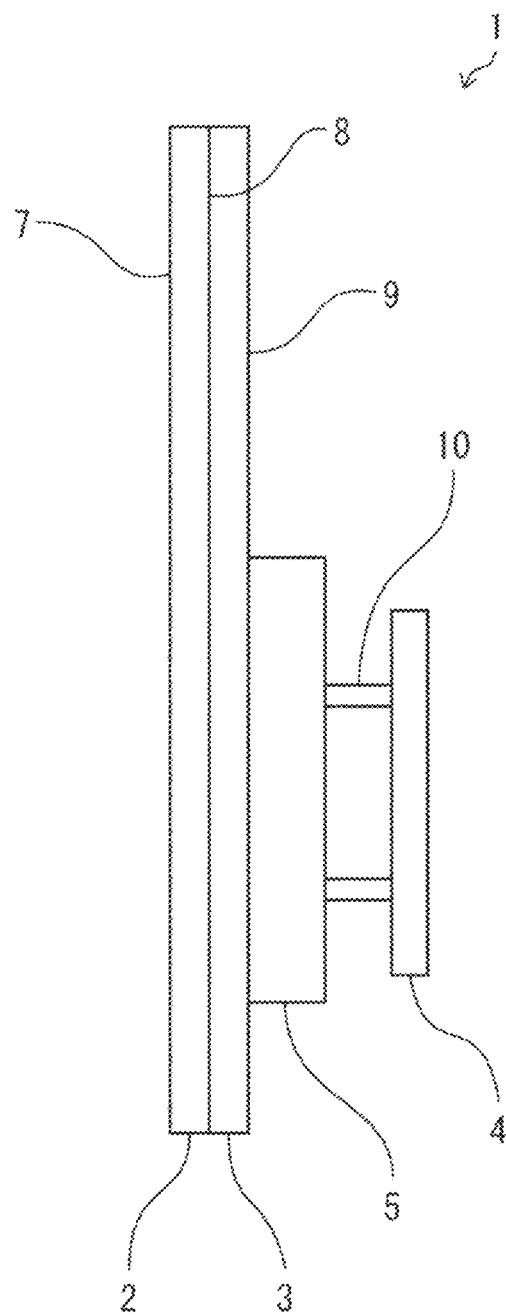
FIG. 1 is a side view of an image display device according to a first embodiment.
Figure 2:
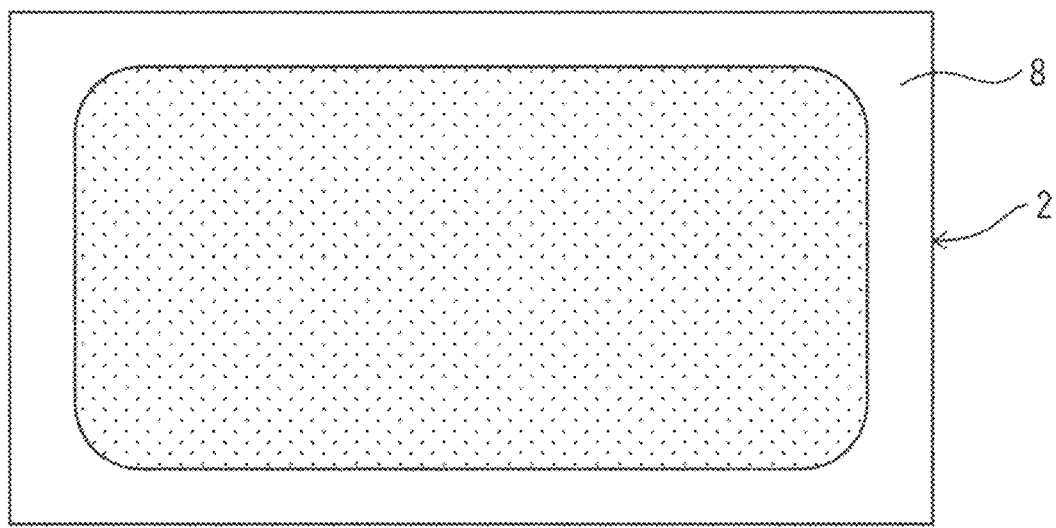
FIG. 2 is a schematic diagram illustrating a temperature distribution of a back surface of a display panel provided in the image display device.

FIG. 1 is a side view of an image display device 1 according to a first embodiment. FIG. 2 is a schematic diagram illustrating a temperature distribution of a back surface 8 of a display panel 2 provided in the image display device 1.

The image display device 1 includes the display panel 2 that displays an image on a front surface 7, an inner plate 3 provided at a side of a back surface 8 of the display panel 2, a circuit board 4 disposed at a position corresponding to a portion of the back surface 8 of the display panel 2 at a side of a back surface 9 of the inner plate 3, and a heat insulating member 5 provided between the circuit board 4 and the inner plate 3.

The heat insulating member 5 may be attached to engage with a plurality of bosses 10 provided at the inner plate 3 for installing the circuit board 4.

The heat insulating member 5 may be disposed at a position including the circuit board 4 when viewed in a direction perpendicular to the back surface 8 of the display panel 2.

As described above, the heat insulating member 5 is provided between the inner plate 3 provided at the side of the back surface 8 of the display panel 2 and the circuit board 4 disposed at the position corresponding to the portion of the back surface 8 of the display panel 2 at the side of the back surface 9 of the inner plate 3. Accordingly, heat generated from the circuit board 4 and directed toward the display panel 2 is blocked by the heat insulating member 5 provided between the inner plate 3 provided at the side of the back surface 8 of the display panel 2 and the circuit board 4. Consequently, the temperature distribution of the back surface 8 of the display panel 2 can be made close to being uniform.

Figure 3:
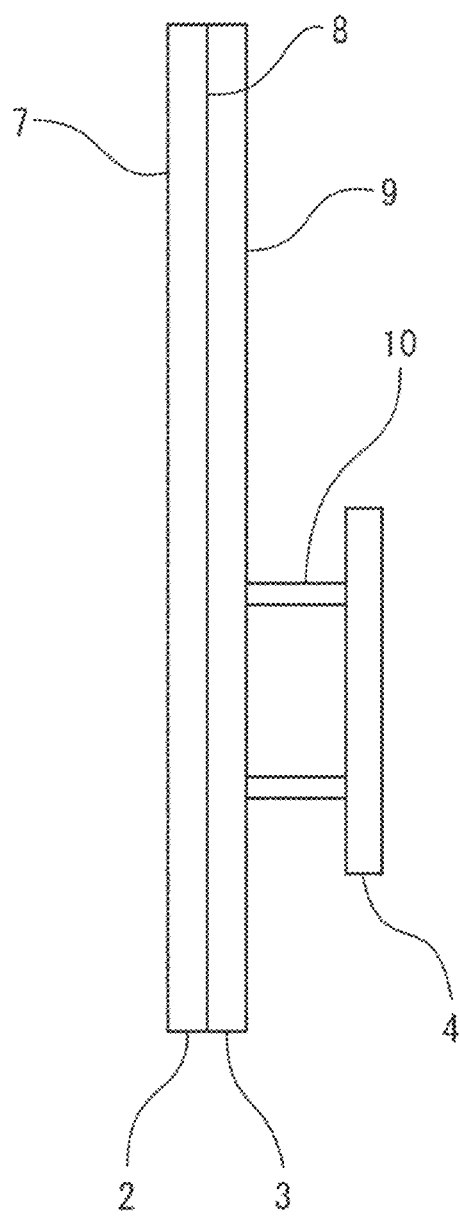
FIG. 3 is a side view of an image display device according to a comparative example.
Figure 4:
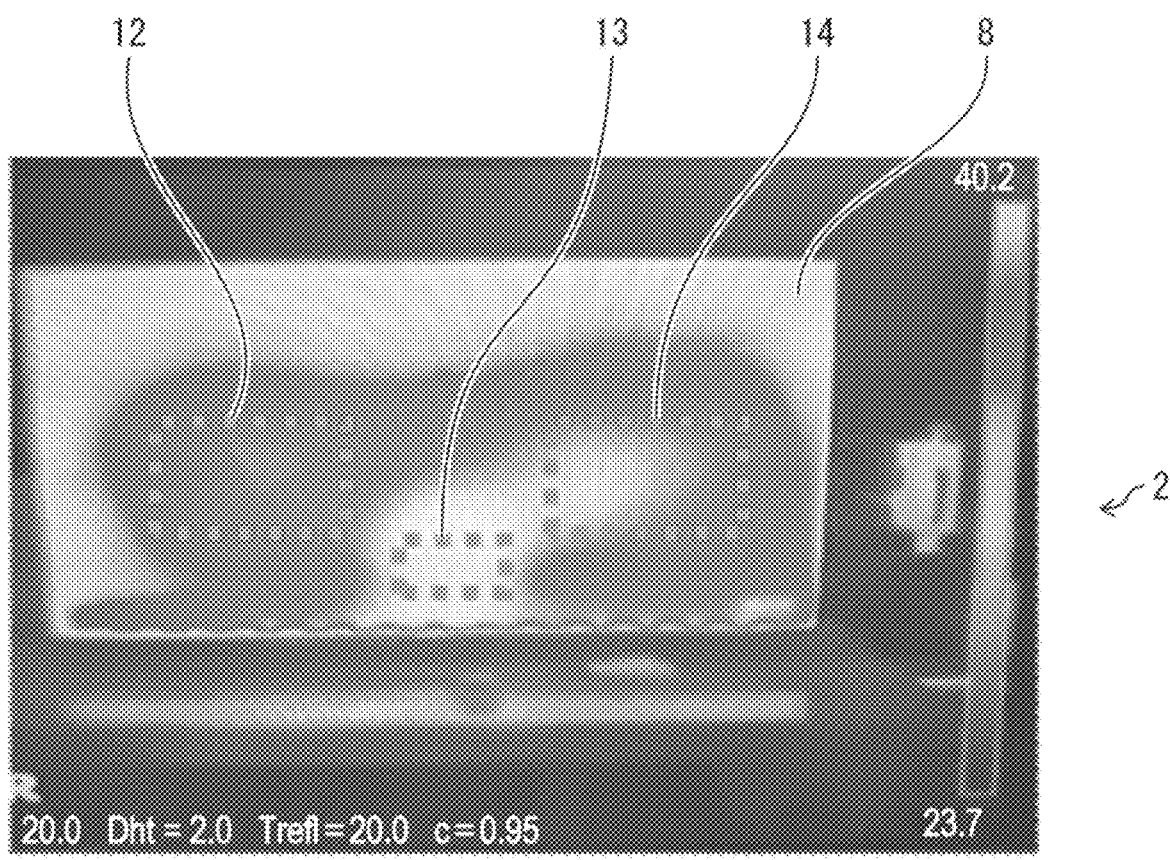
FIG. 4 is an image based on actual measurement data presenting a temperature distribution of a back surface of a display panel provided in the image display device.

FIG. 3 is a side view of an image display device according to a comparative example. FIG. 4 is an image based on actual measurement data presenting a temperature distribution of a back surface of a display panel provided in the image display device according to the comparative example. For convenience of description, members having the same functions as those described above are denoted by the same reference numerals, and description thereof will not be repeated.

The image display device according to the comparative example has a configuration similar to that of the image display device 1 according to the first embodiment except that the heat insulating member 5 is not provided.

Since the heat insulating member 5 is not provided, heat radiated from the circuit board 4 is transferred through the inner plate 3 to regions 12, 13, and 14 in FIG. 4, which are surrounded by broken lines and overlapping the circuit board 4, of the back surface 8 of the display panel 2. Hence, as illustrated in FIG. 4, the temperatures of the regions 12, 13, and 14 of the display panel 2 locally increase and the temperature distribution of the display panel 2 becomes non-uniform.

With the present embodiment, by disposing the heat insulating member 5 at the inner plate 3, the heat insulating member 5 in direct contact with the inner plate 3 suppresses conduction of heat from the circuit board 4 toward the display panel 2 before heat radiated from the circuit board 4 is transferred to the display panel 2. Accordingly, heat transferred from the circuit board 4 through the inner plate 3 to the display panel 2 decreases. Thus, a local temperature increase of the display panel 2 is suppressed. Consequently, the temperature distribution of the display panel 2 becomes more uniform than that of the related art, and local degradation in luminance of the display panel 2 does not occur.

Figure 5:
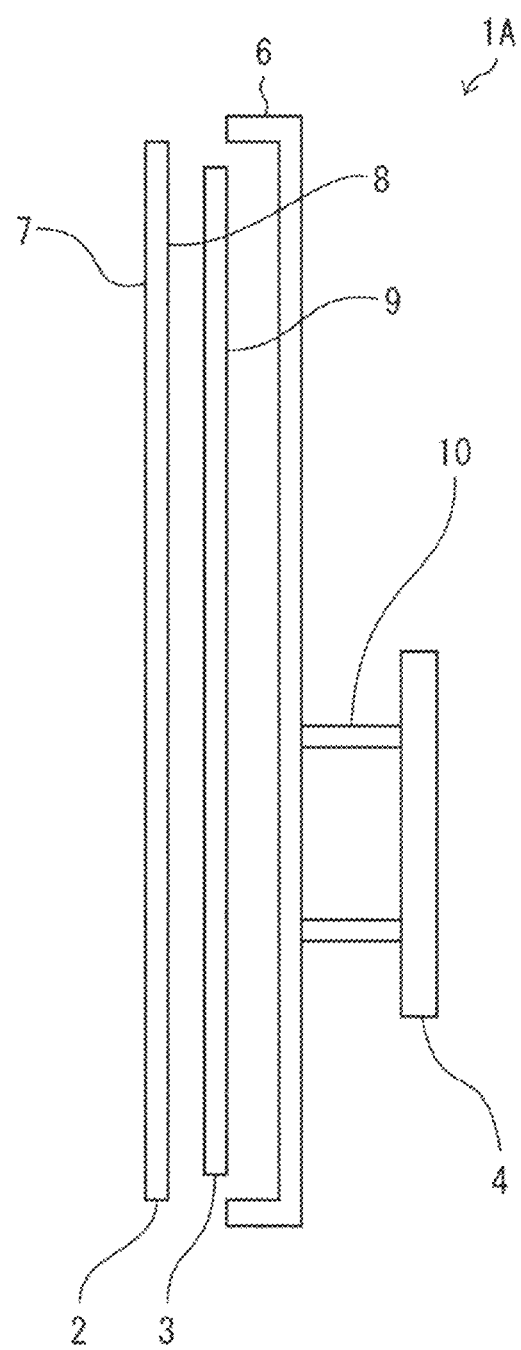
FIG. 5 is a side view of another image display device according to the first embodiment.

FIG. 5 is a side view of another image display device 1A according to the first embodiment. For convenience of description, members having the same functions as those described above are denoted by the same reference numerals, and description thereof will not be repeated.

The image display device 1A may further include a back chassis 6 that supports the display panel 2. The back chassis 6 is configured to function as a heat insulating member that suppresses conduction of heat radiated from the circuit board 4.

As described above, by disposing the back chassis 6 configured as the heat insulating member between the inner plate 3 and the circuit board 4, heat radiated from the circuit board 4 is transferred to the back chassis 6 configured as the heat insulating member. Then, heat is transferred from the back chassis 6 to the inner plate 3. Accordingly, the amount of heat transferred from the inner plate 3 to the display panel 2 is suppressed. Thus, local degradation in luminance of the display panel 2 due to conduction of heat from the circuit board 4 is suppressed.

The heat transferred from the back chassis 6 to the inner plate 3 is equalized by the inner plate 3 and transferred to be spread over the entire surface of the display panel 2. Accordingly, since the heat distribution on the display panel 2 is spread, local degradation in luminance of the display panel 2 is suppressed.

Second Embodiment

Another embodiment of the present disclosure will be described below. For convenience of description, members having the same functions as those described above in the embodiment are denoted by the same reference numerals, and description thereof will not be repeated.

Figure 6:
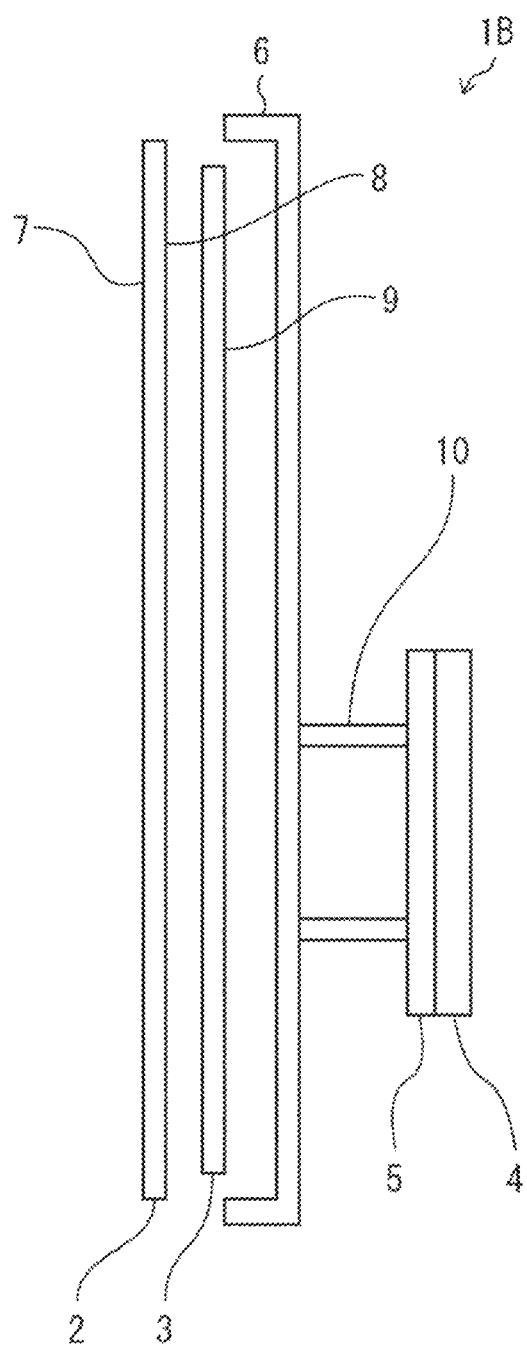
FIG. 6 is a side view of an image display device according to a second embodiment.

FIG. 6 is a side view of an image display device 1B according to a second embodiment. The heat insulating member 5 may be provided between the back chassis 6 that supports the display panel 2, and the circuit board 4.

The heat insulating member 5 may be disposed at a side of the circuit board 4 between the back chassis 6 and the circuit board 4.

The heat insulating member 5 may be attached to engage with the plurality of bosses 10 provided at the back chassis 6 for installing the circuit board 4.

As described above, the heat insulating member 5 is disposed at the side of the circuit board 4 between the back chassis 6 and the circuit board 4. The heat insulating member 5 has substantially the same size as the circuit board 4 when viewed in the direction perpendicular to the display panel 2.

In the image display device 1B configured as described above, conduction of heat radiated from the circuit board 4 is suppressed by the heat insulating member 5 disposed at the side of the circuit board 4. Conduction of the heat is further suppressed by the back chassis 6 and the inner plate 3. Thus, a local temperature increase in the display panel 2 is suitably suppressed. Consequently, degradation in luminance due to local image sticking of the display panel 2 does not occur.

Third Embodiment

Figure 7:
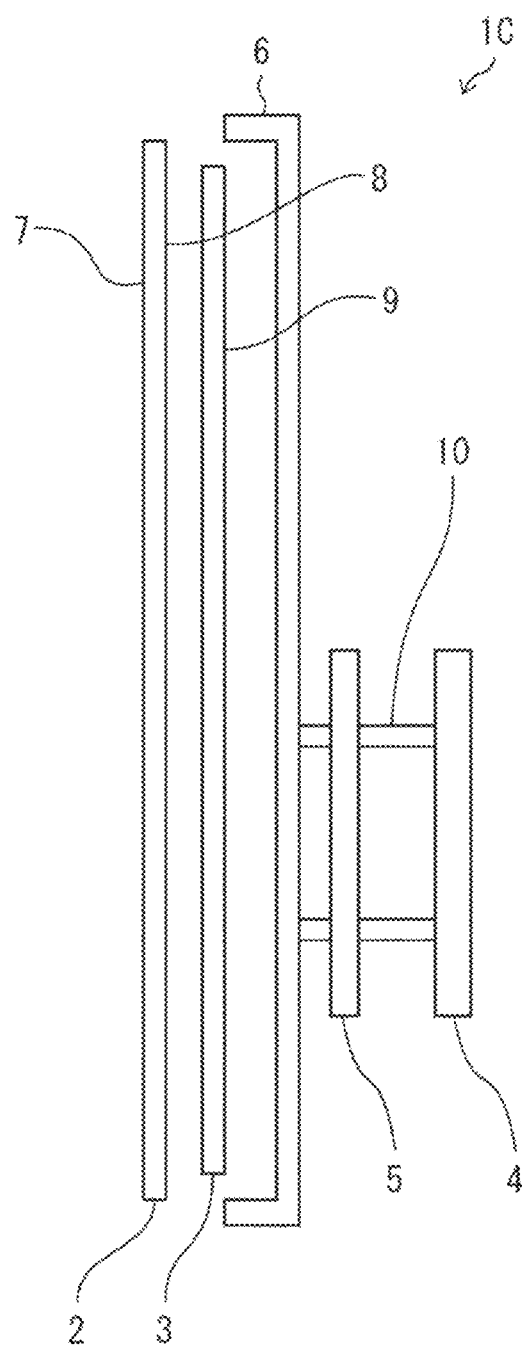
FIG. 7 is a side view of an image display device according to a third embodiment.

FIG. 7 is a side view of an image display device 1C according to a third embodiment. For convenience of description, members having the same functions as those described above in the embodiment are denoted by the same reference numerals, and description thereof will not be repeated.

The heat insulating member 5 may be disposed at a side of the back chassis 6 between the back chassis 6 and the circuit board 4. The heat insulating member 5 has at least substantially the same size as the size of the circuit board 4.

In the image display device 1C configured as described above, conduction of heat radiated from the circuit board 4 is suppressed by the heat insulating member 5 disposed at the side of the back chassis 6. Conduction of the heat is further suppressed by the back chassis 6 and the inner plate 3. Thus, a local temperature increase in the display panel 2 is suitably suppressed. Consequently, degradation in luminance due to local image sticking of the display panel 2 does not occur.

Fourth Embodiment

Figure 8:
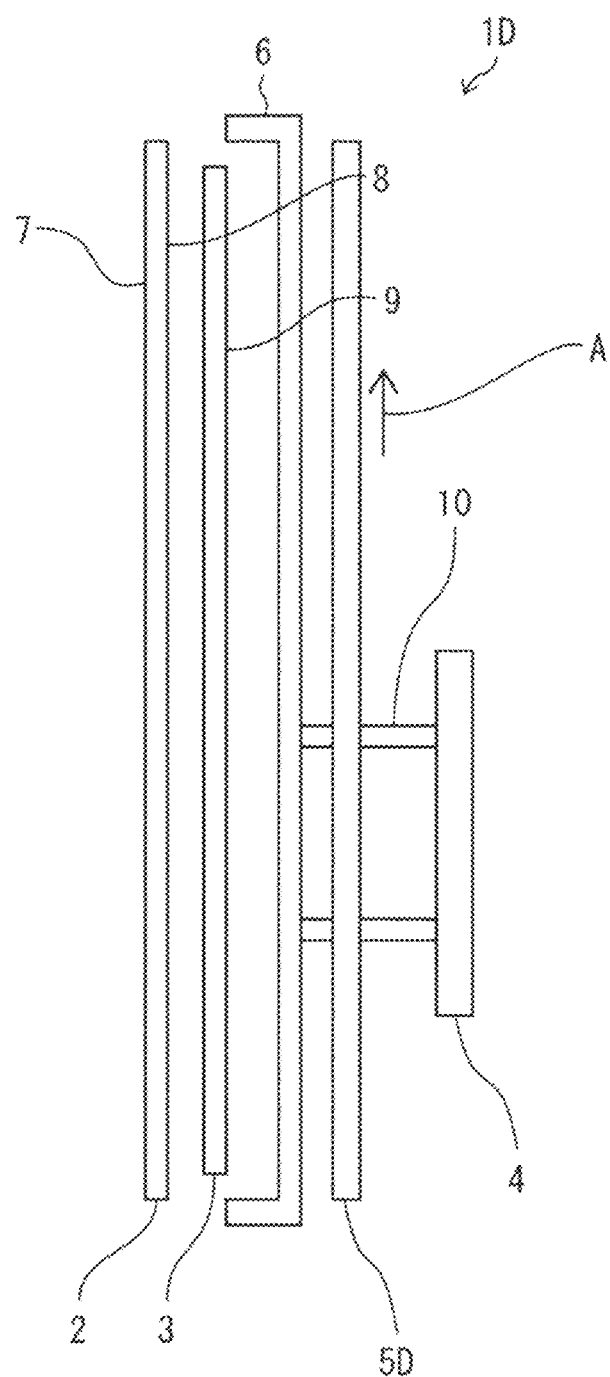
FIG. 8 is a side view of an image display device according to a fourth embodiment.

FIG. 8 is a side view of an image display device 1D according to a fourth embodiment. For convenience of description, members having the same functions as those described above in the embodiment are denoted by the same reference numerals, and description thereof will not be repeated.

A heat insulating member 5D of the image display device 1D may be disposed over the entire surface of the back chassis 6.

In the image display device 1D configured as described above, conduction of heat radiated from the circuit board 4 is suppressed by the heat insulating member 5D. The heat is transferred through the heat insulating member 5D in an upward direction indicated by arrow A. Accordingly, the amount of heat transferred from the heat insulating member 5D to the back chassis 6 and the inner plate 3 decreases. Further, conduction of heat from the heat insulating member 5D toward the display panel 2 is suppressed by the back chassis 6 and the inner plate 3. Consequently, degradation in luminance due to local image sticking of the display panel 2 does not occur.

Fifth Embodiment

Figure 9:
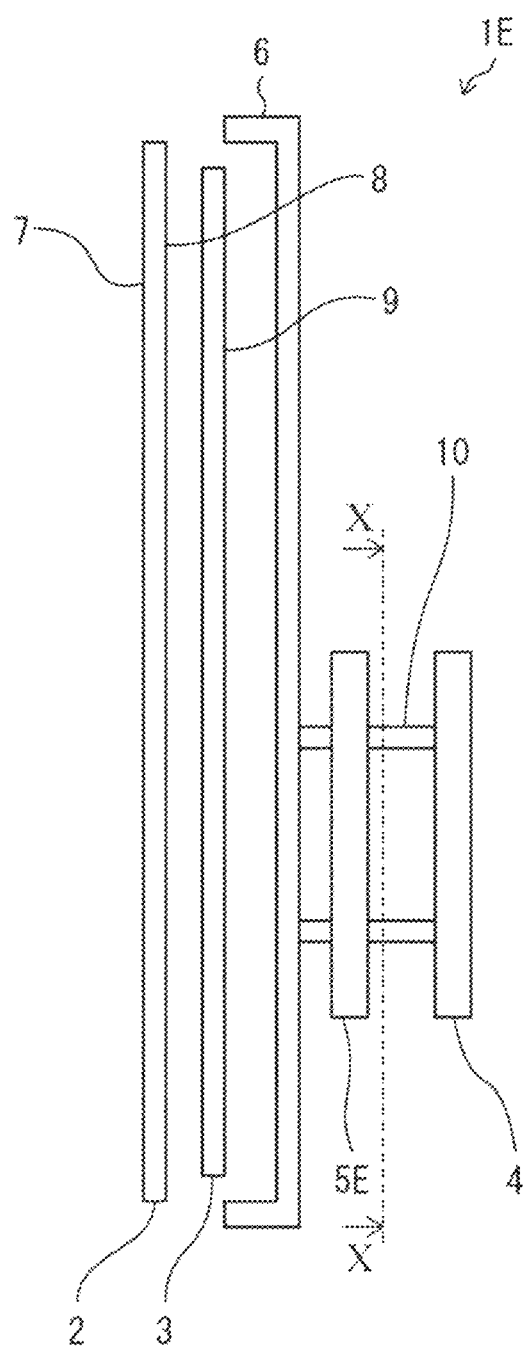
FIG. 9 is a side view of an image display device according to a fifth embodiment.
Figure 10:
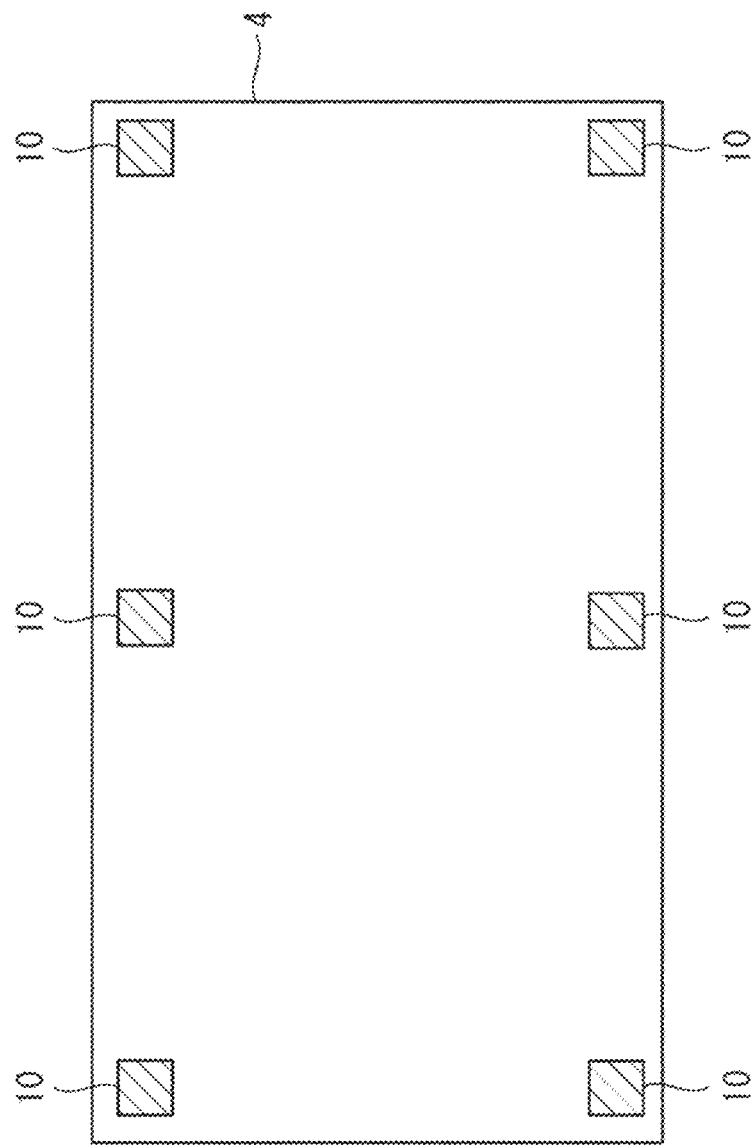
FIG. 10 is a cross-sectional view taken along line X-X illustrated in FIG. 9.
Figure 11:
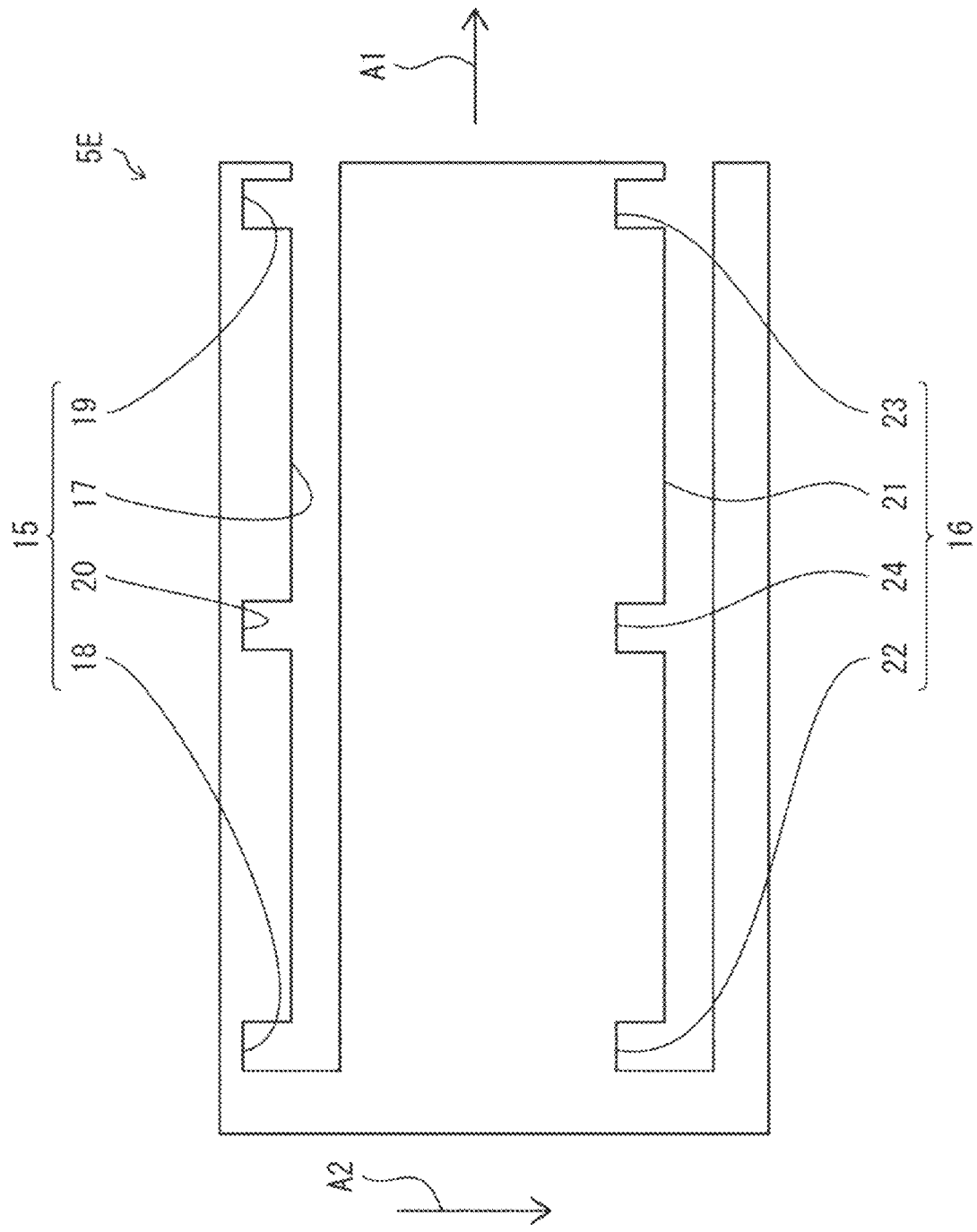
FIG. 11 is a plan view of a heat insulating member provided in the image display device.

FIG. 9 is a side view of an image display device 1E according to a fifth embodiment. FIG. 10 is a cross-sectional view taken along line X-X illustrated in FIG. 9. FIG. 11 is a plan view of a heat insulating member 5E provided in the image display device 1E. For convenience of description, members having the same functions as those described above in the embodiment are denoted by the same reference numerals, and description thereof will not be repeated.

For example, as illustrated in FIG. 10, the bosses 10 for installing the circuit board 4 each are formed in a substantially quadrangular prism shape, and include six bosses corresponding to the four corners and the centers of the long sides of the circuit board 4, provided at the back chassis 6.

As illustrated in FIG. 11, the heat insulating member 5E may have notches 15 and 16 for engaging with the six bosses 10.

The notch 15 includes a notch long hole portion 17 extending along one long side from one short side of the heat insulating member 5E, and three engagement hole portions 18, 19, and 20 protruding from both ends and the center of the notch long hole portion 17 toward the one long side for engaging with the left upper boss 10, the right upper boss 10, and the center upper boss 10. The notch 16 includes a notch long hole portion 21 extending along the other long side from the one short side of the heat insulating member 5E, and three engagement hole portions 22, 23, and 24 protruding from both ends and the center of the notch long hole portion 21 toward the one long side for engaging with the left lower boss 10, the right lower boss 10, and the center lower boss 10.

In order to attach the heat insulating member 5E to the image display device 1E, first, the heat insulating member 5E is inserted between the back chassis 6 and the circuit board 4 in a direction of arrow A1 so that the notch long hole portions 17 and 21 correspond to the positions of the bosses 10. Then, the heat insulating member 5E is moved in a direction of arrow A2, and the engagement hole portions 18, 19, and 20 and the engagement hole portions 22, 23, and 24 are engaged with the respective six bosses 10.

Accordingly, the heat insulating member 5E can be attached by being inserted from a lateral side of the bosses 10 on which the circuit board 4 is installed, and the heat insulating member 5E can be easily attached to the image display device 1E.

Figure 12:
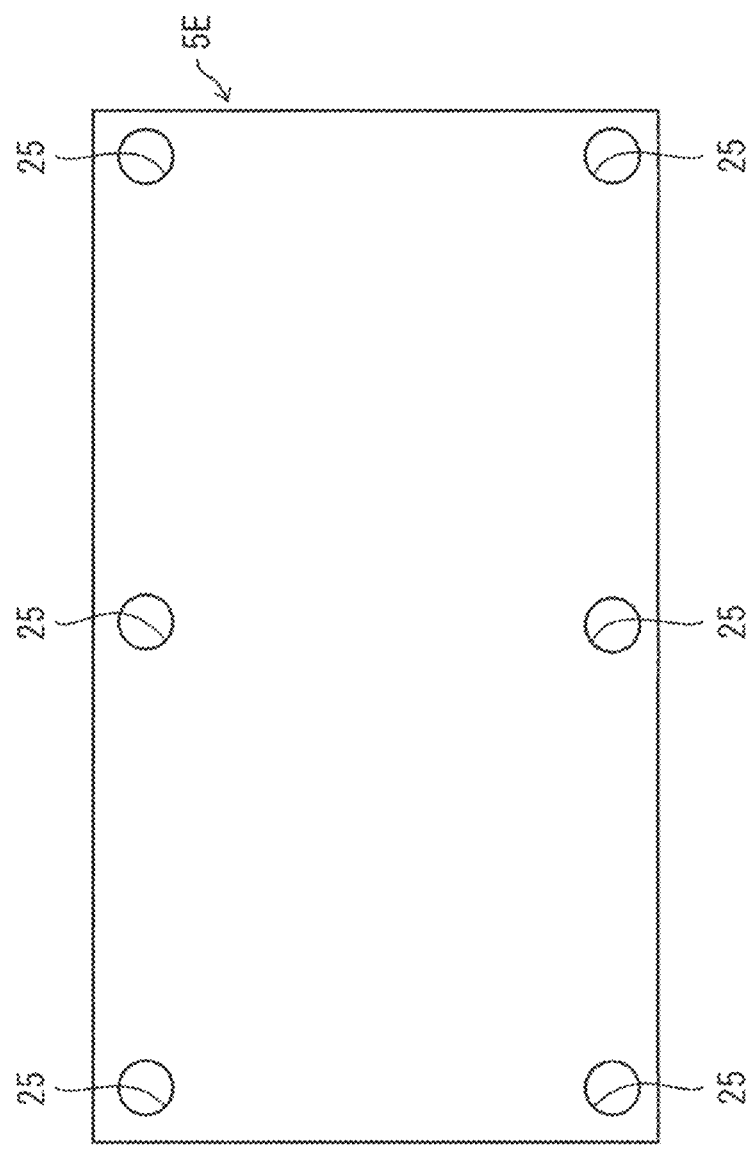
FIG. 12 is a plan view of another heat insulating member provided in the image display device.

FIG. 12 is a plan view of another heat insulating member 5E provided in the image display device 1E. The other heat insulating member 5E has six substantially cylindrical bored holes 25 bored at positions corresponding to the respective six bosses 10.

In order to attach the heat insulating member 5E to the image display device 1E, first, the six bosses 10 are attached to the back chassis 6. The six bored holes 25 of the heat insulating member 5E are made to correspond to the positions of the six bosses 10, and the heat insulating member 5E is inserted into the bosses 10. Then, the circuit board 4 is attached to end surfaces of the six bosses 10.

Accordingly, the heat insulating member 5E can be firmly attached to the image display device 1E.

Sixth Embodiment

Figure 13:
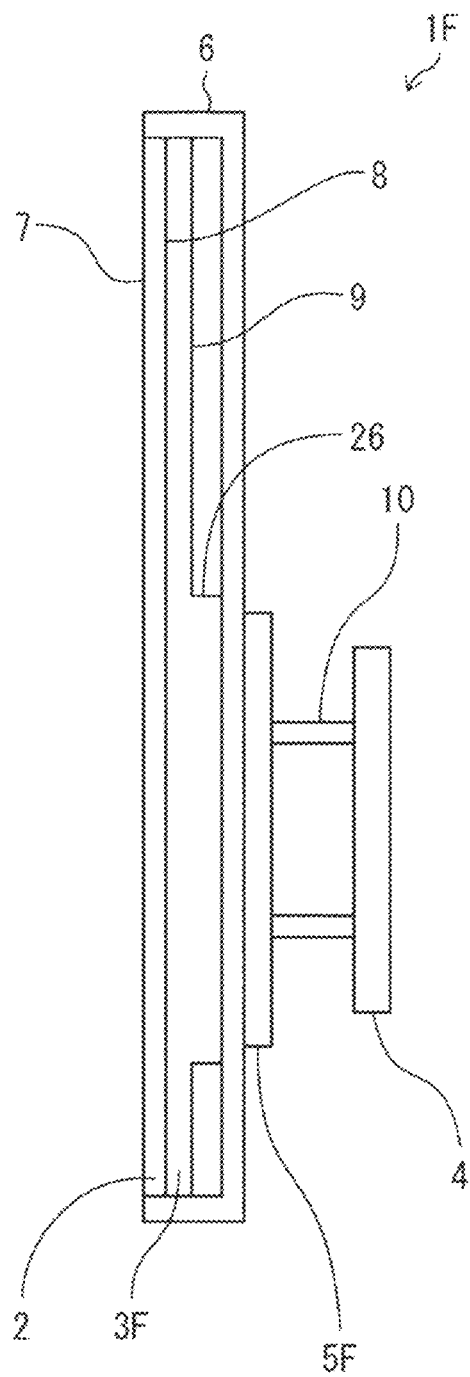
FIG. 13 is a side view of an image display device according to a sixth embodiment.

FIG. 13 is a side view of an image display device 1F according to a sixth embodiment. For convenience of description, members having the same functions as those described above in the embodiment are denoted by the same reference numerals, and description thereof will not be repeated.

The image display device 1F includes an inner plate 3F provided at a side of the back surface 8 of the display panel 2. The inner plate 3F may have a protruding portion 26 protruding from a back surface 9 thereof toward the circuit board 4, and the thickness thereof may partially change.

The back surface 9 of the inner plate 3F is disposed at an interval of several millimeters from the back chassis 6 in the direction perpendicular to the display panel 2.

The protruding portion 26 of the inner plate 3F is formed at a position including the circuit board 4 when viewed in the direction perpendicular to the display panel 2, and is formed in a range substantially equivalent to the heat insulating member 5F. The heat insulating member 5F may be formed at a position including the circuit board 4 when viewed in the direction perpendicular to the display panel 2.

The heat insulating member 5F is attached by notches being engaged with the bosses 10. Accordingly, although heat radiated from the circuit board 4 is insulated by the heat insulating member 5F, heat transferred from the circuit board 4 through the bosses 10 passes through the notches of the heat insulating member 5F and is transferred to the back chassis 6.

Hence, heat transferred from the bosses 10 to the back chassis 6 is equalized by the protruding portion 26 provided at the inner plate 3F.

Accordingly, even if the temperature of connecting portions between the bosses 10 and the back chassis 6 increases due to heat transferred from the bosses 10 to the back chassis 6, heat transferred to a side of the display panel 2 with respect to the back chassis 6 can be equalized by providing the protruding portion 26 at the inner plate 3F disposed at the side of the display panel 2 with respect to the back chassis 6.

Figure 14:
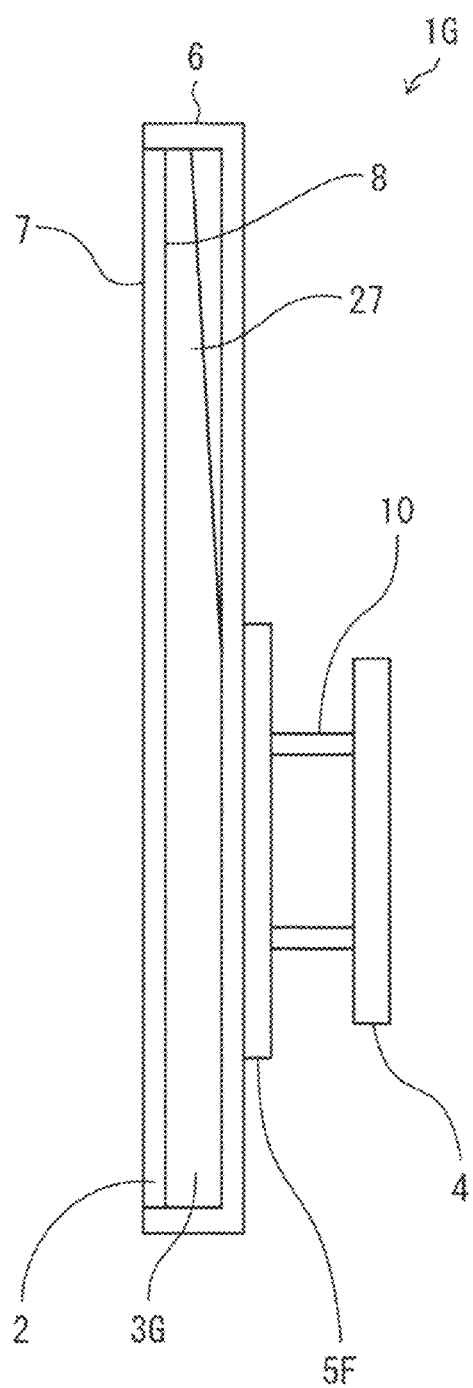
FIG. 14 is a side view of another image display device according to the sixth embodiment.

FIG. 14 is a side view of another image display device 1G according to the sixth embodiment. For convenience of description, members having the same functions as those described above in the embodiment are denoted by the same reference numerals, and description thereof will not be repeated.

The image display device 1G includes an inner plate 3G provided at a side of the back surface 8 of the display panel 2. The inner plate 3G may have an inclined portion 27 that is inclined such that the thickness decreases upward from a position corresponding to an upper end of the circuit board 4, and the thickness thereof may partially change.

The inclined portion 27 provided at the inner plate 3G equalizes heat transferred from the bosses 10 to the back chassis 6.

With this configuration, heat transferred from the bosses 10 to the back chassis 6 can be equalized without increasing the thickness of a housing of the image display device 1G by providing the inclined portion 27 at the inner plate 3G. Accordingly, an effect of equalization in heat can be obtained while the image display device 1G is thinned.

As described above, even when the temperature of the connecting portions between the bosses 10 and the back chassis 6 increases due to heat transferred from the bosses 10 to the back chassis 6, heat transferred to a side of the display panel 2 with respect to the back chassis 6 can be equalized by providing the inclined portion 27 at the inner plate 3G disposed at the side of the display panel 2 with respect to the back chassis 6.

Seventh Embodiment

Figure 15:
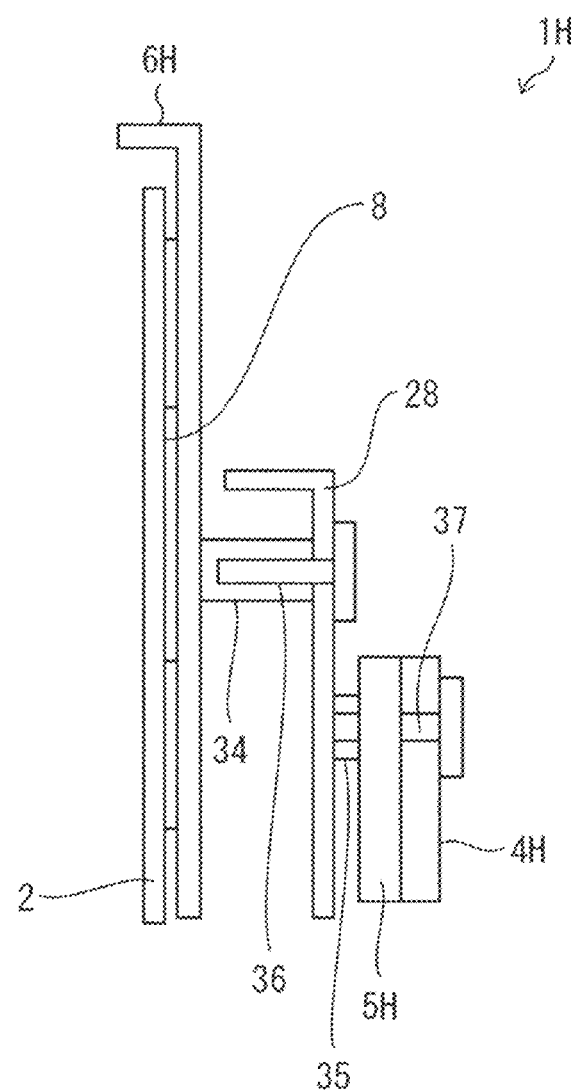
FIG. 15 is a side view of an image display device according to a seventh embodiment.

FIG. 15 is a side view of an image display device 1H according to a seventh embodiment. For convenience of description, members having the same functions as those described above in the embodiment are denoted by the same reference numerals, and description thereof will not be repeated.

The image display device 1H has an inner-plateless structure and may include a back chassis 6H provided at the back surface 8 of the display panel 2. The back chassis 6H may be formed to be a flat plane at a side of the back surface 8 of the display panel 2 for trimming the appearance and for fixture and heat radiation of the display panel 2.

A tray chassis 28 may be provided at a side of the back chassis 6H opposite to the display panel 2. The tray chassis 28 is fixed by a plurality of bosses 34 provided at the back chassis 6H and a fastening member 36 for enhancing set strength.

A circuit board 4H and a heat insulating member 5H are provided at a side of the tray chassis 28 opposite to the back chassis 6H. The heat insulating member 5H may be disposed between the circuit board 4H and the tray chassis 28. The circuit board 4H and the heat insulating member 5H are fixed by a plurality of bosses 35 provided at the tray chassis 28 and a fastening member 37. As described above, the heat insulating member 5H is provided between the circuit board 4H and the display panel 2, and may be provided between the circuit board 4H and the back chassis 6H.

Since the heat insulating member 5H is disposed between the circuit board 4H and the tray chassis 28 disposed at the side of the back surface 8 of the display panel 2 as described above, a local temperature increase of the display panel 2 can be suppressed.

Figure 16:
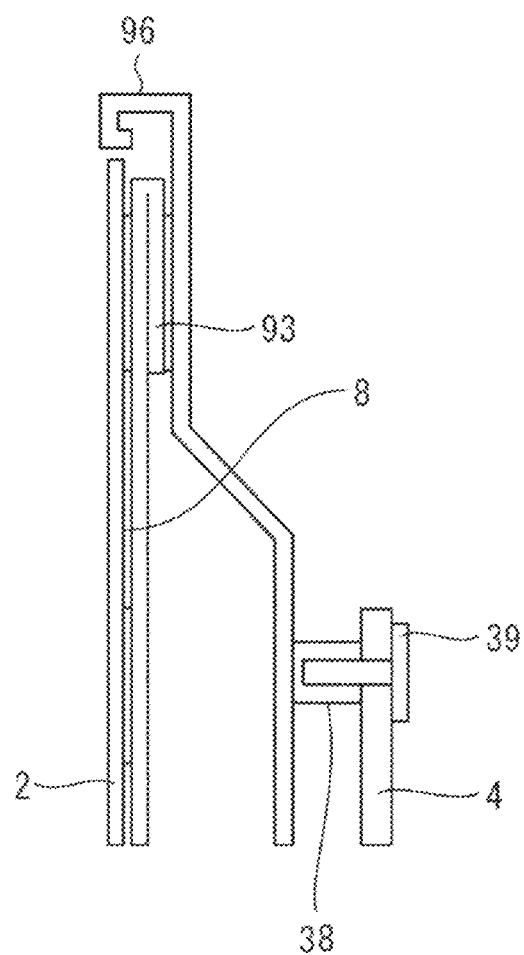
FIG. 16 is a side view of an image display device according to a comparative example.

FIG. 16 is a side view of an image display device according to a comparative example. The image display device includes an inner plate 93 provided at the back surface 8 of the display panel 2. The inner plate 93 is formed to be a flat plane at a side of the back surface 8 of the display panel 2 for fixture and heat radiation of the display panel 2.

A back chassis 96 is provided at a side of the inner plate 93 opposite to the display panel 2. The back chassis 96 has a bent portion that is bent in a direction away from the display panel 2 for trimming the appearance, enhancing set strength, and fixing the circuit board 4 and so forth.

The circuit board 4 is provided at a side of the bent portion of the back chassis 96 opposite to the inner plate 93 and is fixed by a plurality of bosses 38 provided at the back chassis 96 and a fastening member 39.

With this configuration, the temperature of the display panel 2 locally increases due to heat radiation from the circuit board 4.

Figure 17:
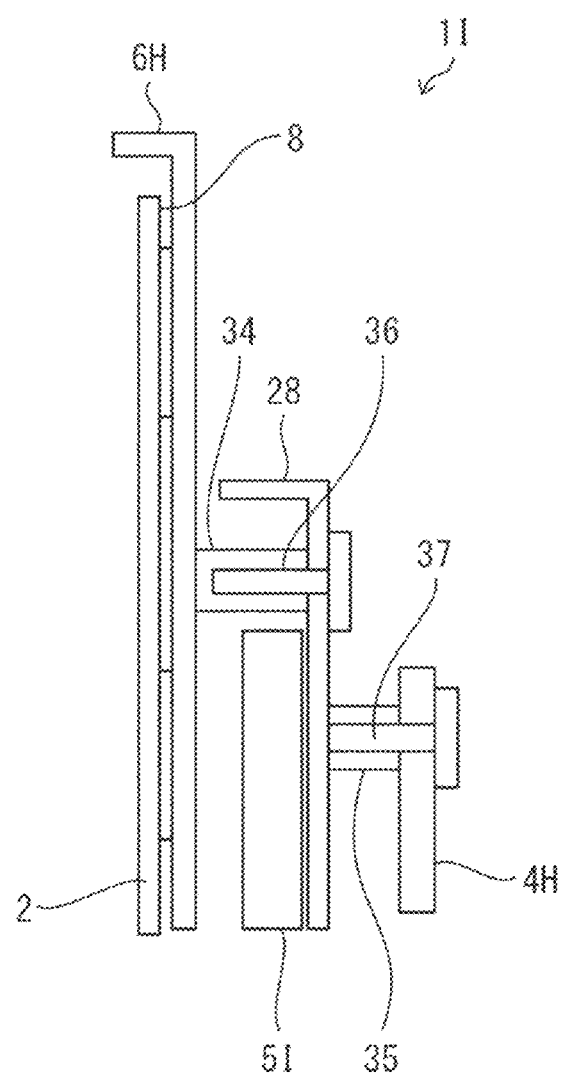
FIG. 17 is a side view of another image display device according to the seventh embodiment.

FIG. 17 is a side view of another image display device 11 according to the seventh embodiment. Components having functions similar to those described above are denoted by like reference numerals, and detailed description of the components will not be repeated.

A heat insulating member 51 may be provided between the tray chassis 28 and the back chassis 6H, and is disposed at a position corresponding to the circuit board 4H. Accordingly, heat generated from the circuit board 4H, passing through the tray chassis 28, and directed toward the display panel 2 is blocked by the heat insulating member 51.

With the inner-plateless structure, as illustrated in FIGS. 15 and 17, since the back chassis 6H is desired to be a flat plane at the side of the back surface 8 of the display panel 2, and, like the comparative example in FIG. 16, since the back chassis 6H is not able to have a shape formed by drawing or bending, the heat insulating member 5H or 51 may be provided by adding the tray chassis 28.

Eighth Embodiment

Figure 18:
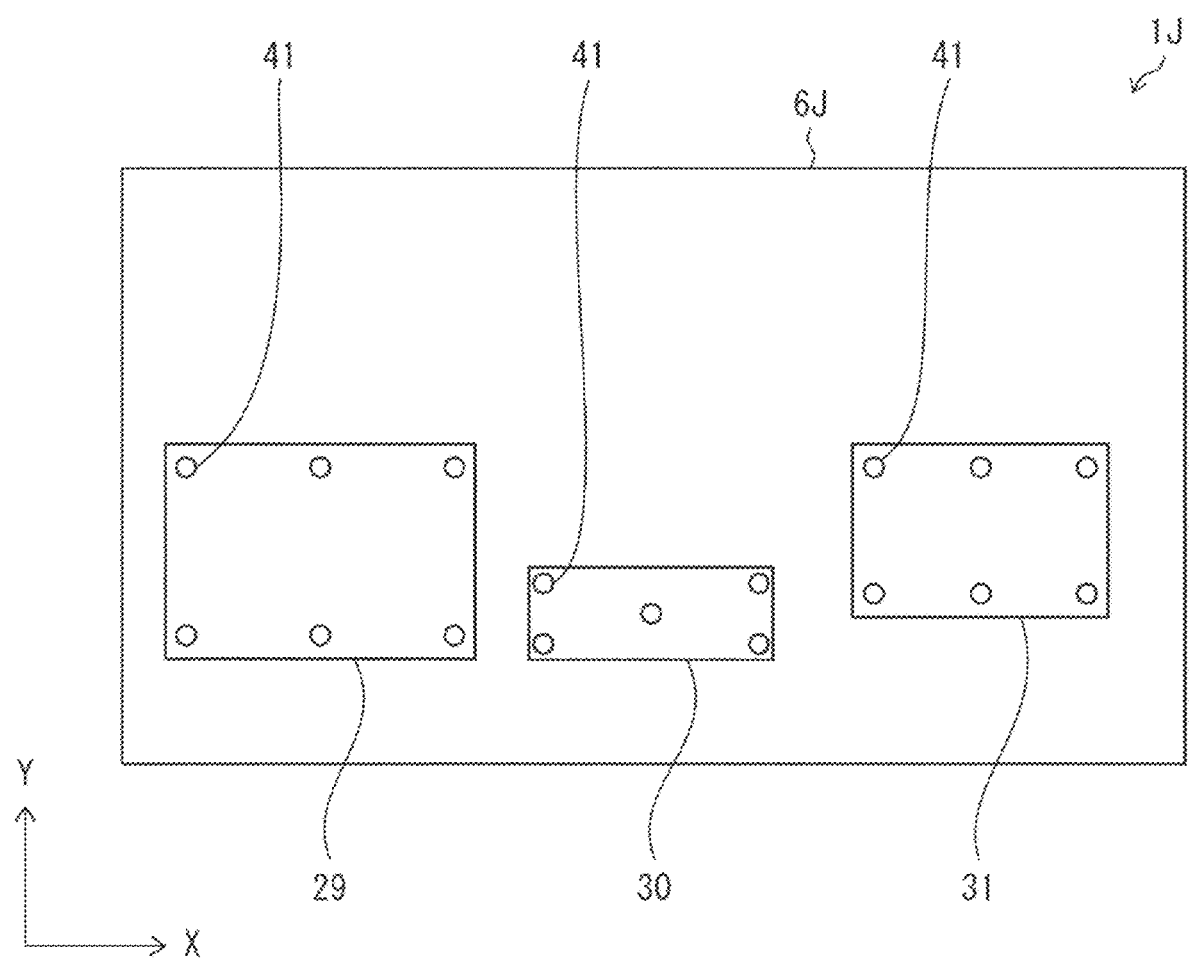
FIG. 18 is a back view of an image display device according to an eighth embodiment.
Figure 19:
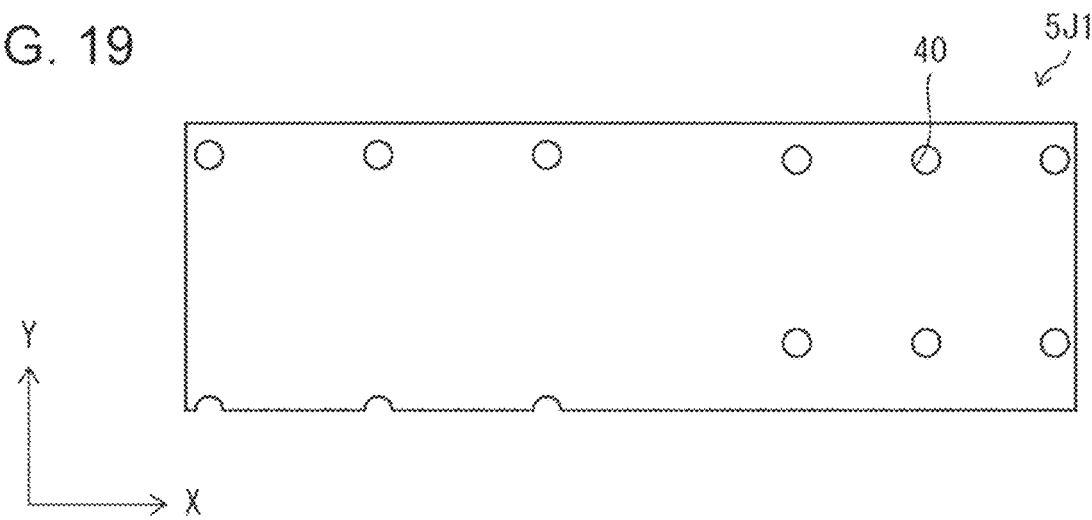
FIG. 19 is a plan view of a heat insulating member provided in the image display device.

FIG. 18 is a back view of an image display device 1J according to an eighth embodiment. FIG. 19 is a plan view of a heat insulating member 5J1 provided in the image display device 1J. Components having functions similar to those described above are denoted by like reference numerals, and detailed description of the components will not be repeated.

The image display device 1J includes a back chassis 6J provided at the back surface 8 of the display panel 2. A power supply board 29, a timing controller (TCON) board 30, and a main board 31 are disposed in this order in the X direction to face the back chassis 6J.

The image display device 1J includes the heat insulating member 5J1 disposed between the back chassis 6J and a subset of the power supply board 29, the ICON board 30, and the main board 31 to be disposed over the power supply board 29, the ICON board 30, and the main board 31 when viewed in the direction perpendicular to the back chassis 6J. The heat insulating member 5J1 may be formed to overlap the power supply board 29, the TCON board 30, and the main board 31. The heat insulating member 5J1 has a plurality of bored holes 40. The power supply board 29, the TCON board 30, and the main board 31 each have a plurality of bored holes 41. The heat insulating member 5J1, the power supply board 29, the TCON board 30, and the main board 31 are fixed to the back chassis 6J by bosses (not illustrated) corresponding to the bored holes 40 and 41 and a fastening member.

Heat radiated from the power supply board 29, the TCON board 30, and the main board 31 is transferred to a region of the back surface 8 of the display panel 2 overlapping the power supply board 29, the TCON board 30, and the main board 31. The temperature of the region of the display panel 2 locally increases and the temperature distribution of the display panel 2 becomes non-uniform.

By providing the heat insulating member 5J1, heat of three boards including the power supply board 29, the TCON board 30, and the main board 31 can be insulated. Since the heat insulating member 5J1 is disposed over the boards, image sticking at an intermediate position among the boards on the back surface 8 of the display panel 2 can be avoided. As described above, by providing the heat insulating member 5J1, a local temperature increase of the display panel 2 can be suppressed.

Figure 20:
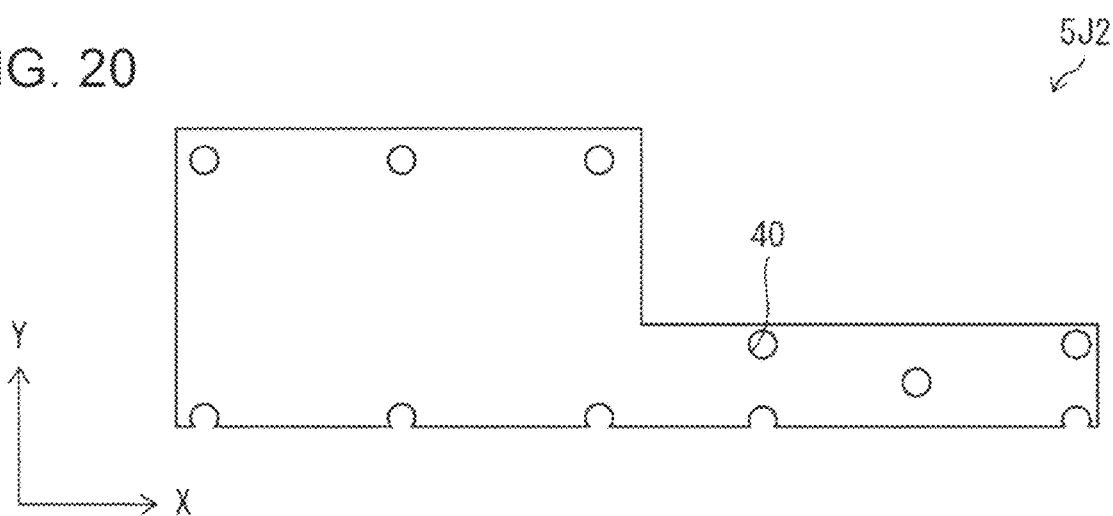
FIG. 20 is a plan view of another heat insulating member provided in the image display device.

FIG. 20 is a plan view of another heat insulating member 5J2 provided in the image display device 1J. Components having functions similar to those described above are denoted by like reference numerals, and detailed description of the components will not be repeated.

The image display device 1J may include the heat insulating member 5J2 disposed between the back chassis 6J and a subset of the power supply board 29 and the ICON board 30 to be disposed over the power supply board 29 and the ICON board 30 when viewed in the direction perpendicular to the back chassis 6J.

Figure 21:
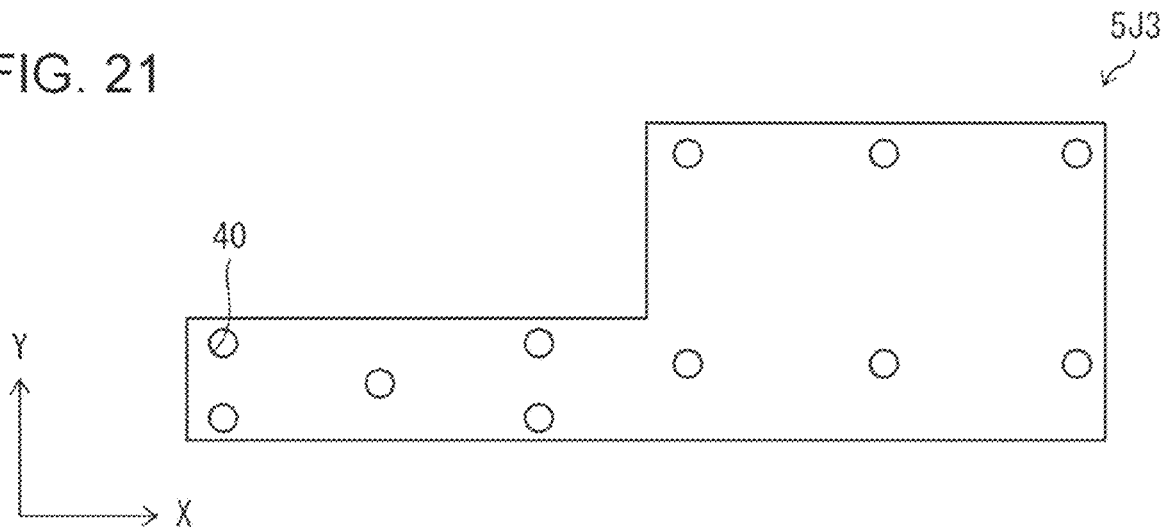
FIG. 21 is a plan view of still another heat insulating member provided in the image display device.

FIG. 21 is a plan view of still another heat insulating member 5J3 provided in the image display device 1J. Components having functions similar to those described above are denoted by like reference numerals, and detailed description of the components will not be repeated.

The image display device 1J may include the heat insulating member 5J3 disposed between the back chassis 6J and a subset of the ICON board 30 and the main board 31 to be disposed over the ICON board 30 and the main board 31.

As described above, the heat insulating member 5J1, 5J2, or 5J3 is disposed over at least two of the boards.

Ninth Embodiment

Figure 22:
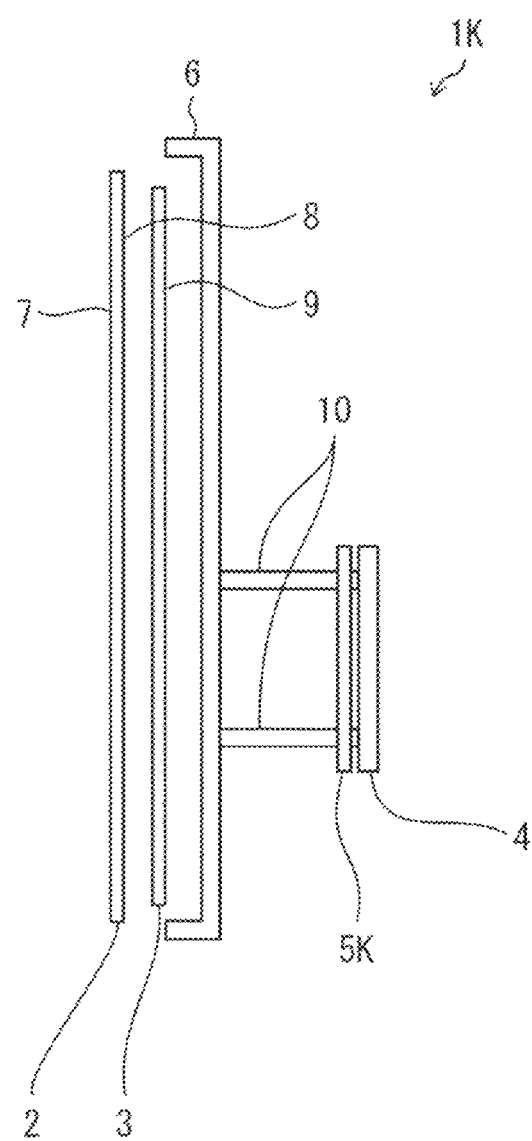
FIG. 22 is a side view of an image display device according to a ninth embodiment.

FIG. 22 is a side view of an image display device 1K according to a ninth embodiment. Components having functions similar to those described above are denoted by like reference numerals, and detailed description of the components will not be repeated.

The image display device 1K includes a heat insulating member 5K. The heat insulating member 5K has an electrically insulating function in addition to a heat insulating function for heat generated from the circuit board 4. The heat insulating member 5K may be made of resin, for example, polycarbonate.

The heat insulating member 5K may be provided at a side of the circuit board 4 between the back chassis 6 and the circuit board 4, and is attached to engage with the plurality of bosses 10 provided at the back chassis 6 for installing the circuit board 4.

Tenth Embodiment

Figure 23:
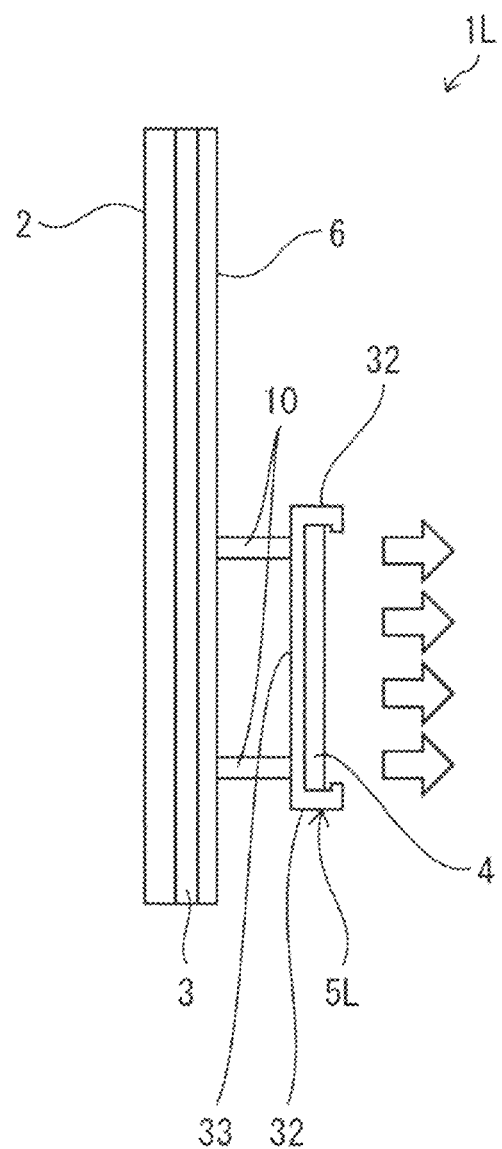
FIG. 23 is a side view of an image display device according to a tenth embodiment.
Figure 24:
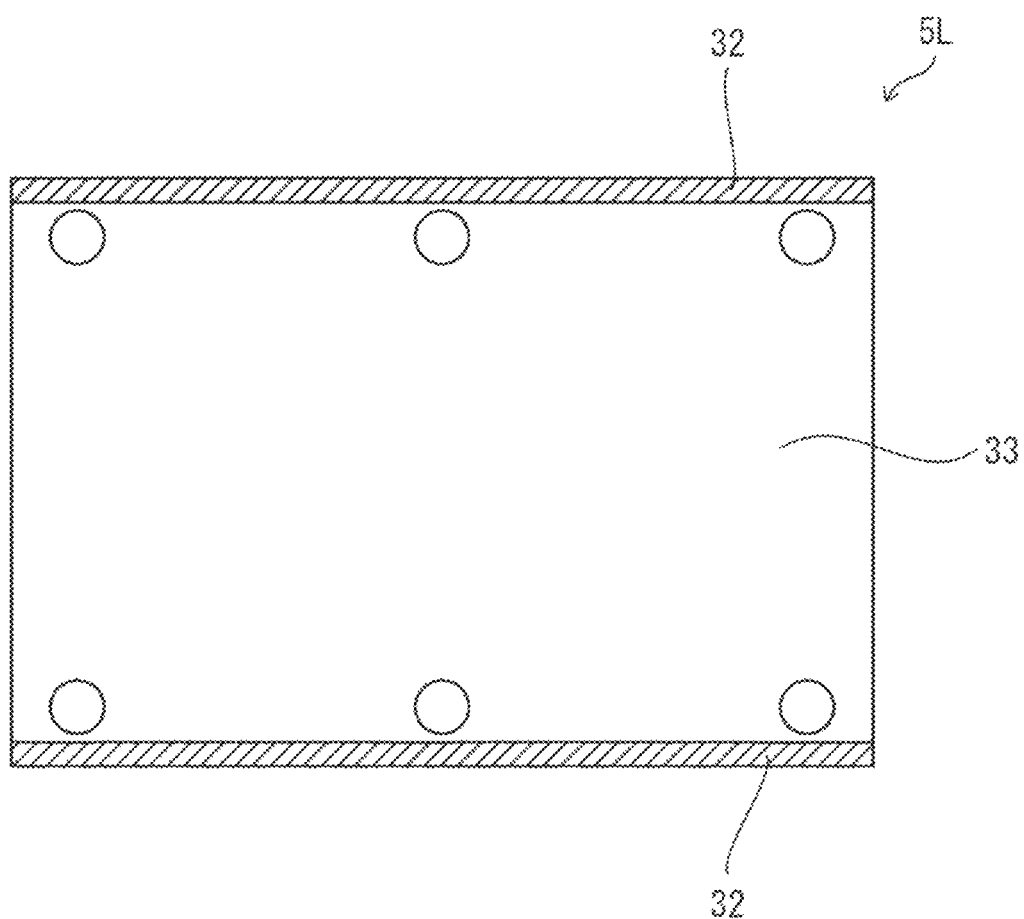
FIG. 24 is a plan view of a heat insulating member provided in the image display device.

FIG. 23 is a side view of an image display device 1L according to a tenth embodiment. FIG. 24 is a plan view of a heat insulating member 5L provided in the image display device 1L. Components having functions similar to those described above are denoted by like reference numerals, and detailed description of the components will not be repeated.

The image display device 1L may include the heat insulating member 5L formed to cover the circuit board 4. The heat insulating member 5L includes a bottom plate portion 33 formed to cover a surface of the circuit board 4 at a side of the display panel 2, and side plate portions 32 protruding from both ends of the bottom plate portion 33 to cover end surfaces of the circuit board 4.

Since the heat insulating member 5L is formed to cover the circuit board 4 as described above, heat generated from the circuit board 4 can be released from a surface of the circuit board 4 opposite to the display panel 2. Accordingly, conduction of heat released from the circuit board 4 to the display panel 2 can be avoided.

Eleventh Embodiment

Figure 25:
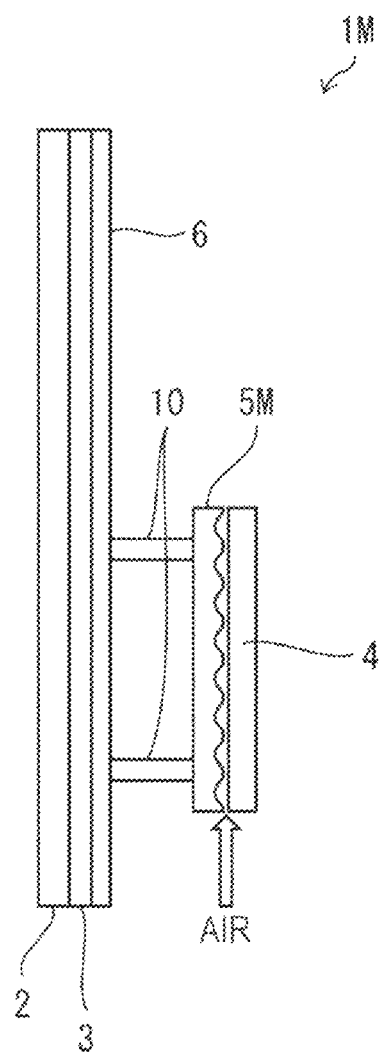
FIG. 25 is a side view of an image display device according to an eleventh embodiment.

FIG. 25 is a side view of an image display device 1M according to an eleventh embodiment. Components having functions similar to those described above are denoted by like reference numerals, and detailed description of the components will not be repeated.

The image display device 1M includes a heat insulating member 5M. The heat insulating member 5M may be formed to have a surface facing the circuit board 4 and having an uneven shape.

Accordingly, air can circulate through gaps between the circuit board 4 and the heat insulating member 5M. Hence, heat generated at the circuit board 4 can be released with air. Consequently, a local temperature increase of the display panel 2 can be suppressed. Thus, occurrence of a local change in luminance of the display panel 2 can be avoided.

Twelfth Embodiment

Figure 26:
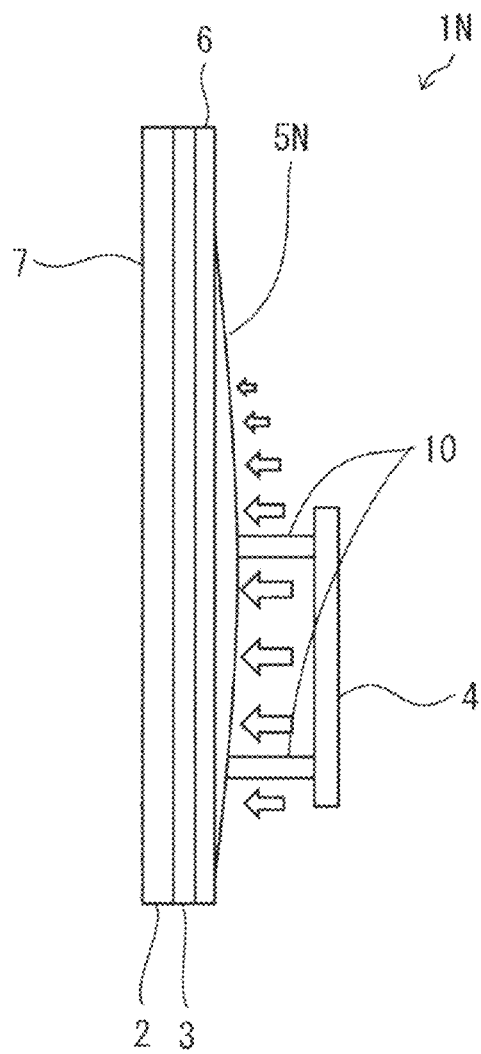
FIG. 26 is a side view of an image display device according to a twelfth embodiment.

FIG. 26 is a side view of an image display device 1N according to a twelfth embodiment. Components having functions similar to those described above are denoted by like reference numerals, and detailed description of the components will not be repeated.

The image display device 1N includes a heat insulating member 5N. The heat insulating member 5N is disposed at a side of the back chassis 6 opposite to the display panel 2. The heat insulating member 5N is formed to decrease in thickness as being away from the circuit board 4 in a direction parallel to the front surface 7 of the display panel 2. The circuit board 4 is attached to the plurality of bosses 10 provided at the back chassis 6.

Accordingly, when heat released from the circuit board 4 is insulated by the heat insulating member 5N, heat conduction at a position at which the circuit board 4 overlaps the display panel 2 is suppressed, and heat released from the circuit board 4 can be suppressed. Consequently, a local temperature increase of the display panel 2 can be suppressed. Thus, occurrence of a local change in luminance of the display panel 2 can be avoided.

Thirteenth Embodiment

Figure 27:
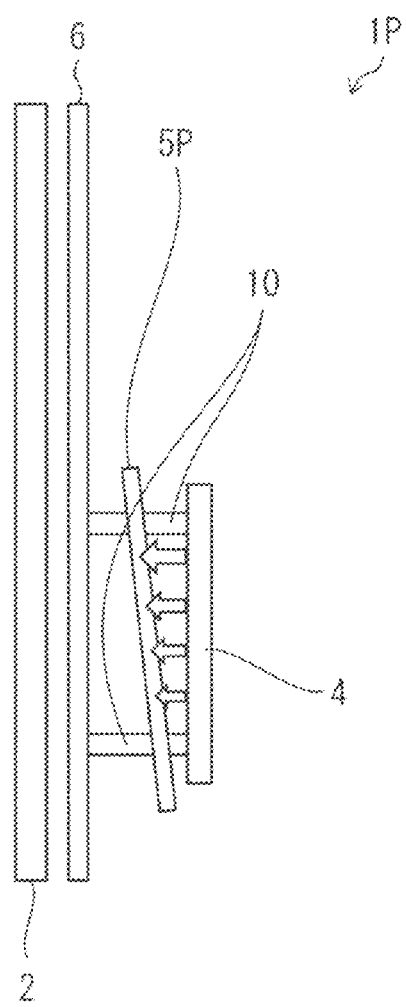
FIG. 27 is a side view of an image display device according to a thirteenth embodiment.

FIG. 27 is a side view of an image display device 1P according to a thirteenth embodiment. Components having functions similar to those described above are denoted by like reference numerals, and detailed description of the components will not be repeated.

The image display device 1P includes a heat insulating member 5P. The heat insulating member 5P is provided between the back chassis 6 and the circuit board 4, and is disposed in a posture inclined with respect to the circuit board 4. The heat insulating member 5P may be attached to engage with the plurality of bosses 10 provided at the back chassis 6 for installing the circuit board 4.

Heat radiated from the circuit board 4 is transferred to a region of the back surface 8 of the display panel 2 overlapping the circuit board 4. The temperature of the region of the display panel 2 locally increases and the temperature distribution of the display panel 2 becomes non-uniform.

When heat released from the circuit board 4 is insulated, heat conduction at a position at which the circuit board 4 overlaps the display panel 2 is suppressed. By changing the inclination of the heat insulating member 5P, a heat distribution at the position overlapping the circuit board 4 can be adjusted. Consequently, a local temperature increase of the display panel 2 can be suppressed.

Overview

An image display device 1, 1A, 1B, 1C, 1D, 1E, 1F, or 1G according to a first aspect of the present disclosure includes a display panel 2 that displays an image; an inner plate 3, 3F, or 3G provided at a side of a back surface 8 of the display panel 2; a circuit board 4 disposed at a position corresponding to a portion of the back surface 8 of the display panel 2 at a side of a back surface 9 of the inner plate 3, 3F, or 3G; and a heat insulating member 5, 5D, 5E, or 5F provided between the circuit board 4 and the inner plate 3, 3F, or 3G.

With the above-described configuration, heat generated from the circuit board and directed toward the display panel is blocked by the heat insulating member provided between the inner plate provided at the side of the back surface of the display panel and the circuit board disposed at the position corresponding to the portion of the back surface of the display panel at the side of the back surface of the inner plate. Accordingly, a local temperature increase of the display panel is suppressed. Consequently, an image display device that can make a temperature distribution of the back surface of the display panel close to being uniform can be provided.

In the image display device 1A according to a second aspect of the present disclosure, based on the first aspect, the heat insulating member 5 may include a back chassis 6 that supports the display panel 2.

With the above-described configuration, the function of the heat insulating member can be provided by the back chassis. Accordingly, a local temperature increase of the display panel can be suppressed with a simple configuration.

In the image display device 1B, 1C, 1D, 1E, 1F, or 1G according to a third aspect of the present disclosure, based on the first aspect, the heat insulating member 5 may be provided between a back chassis 6 that supports the display panel 2, and the circuit board 4.

With the above-described configuration, heat generated from the circuit board and directed toward the display panel can be blocked by the heat insulating member provided between the back chassis 6 that supports the display panel 2, and the circuit board 4.

In the image display device 1B according to a fourth aspect of the present disclosure, based on the third aspect, the heat insulating member 5 may be disposed at a side of the circuit board 4 between the back chassis 6 and the circuit board 4.

With the above-described configuration, conduction of heat radiated from the circuit board is suppressed by the heat insulating member disposed at the side of the circuit board.

In the image display device 1C according to a fifth aspect of the present disclosure, based on the third aspect, the heat insulating member 5 may be disposed at a side of the back chassis 6 between the back chassis 6 and the circuit board 4.

With the above-described configuration, conduction of heat radiated from the circuit board is suppressed by the heat insulating member disposed at the side of the back chassis.

In the image display device 1D according to a sixth aspect of the present disclosure, based on the third aspect, the heat insulating member 5D may be disposed over an entire surface of the back chassis 6.

With the above-described configuration, conduction of heat radiated from the circuit board is suppressed by the heat insulating member 5 disposed over the entire surface of the back chassis. The heat is transferred upward through the heat insulating member. Accordingly, the amount of heat transferred from the heat insulating member to the back chassis and the inner plate decreases.

The image display device 1, 1A, 1B, 1C, 1D, 1E, 1F, or 1G according to a seventh aspect of the present disclosure, based on the first aspect, may further include a back chassis 6 that supports the display panel 2, and the back chassis 6 may be provided with a boss 10 for installing the circuit board 4 and the heat insulating member 5, 5D, 5E, or 5F may be attached to be engaged with the boss 10.

With the above-described configuration, the boss provided at the back chassis for installing the circuit board can be also used for attaching the heat insulating member.

In the image display device 1E, 1F, or 1G according to an eighth aspect of the present disclosure, based on the seventh aspect, the heat insulating member 5E or 5F may have a notch 15 or 16 for engaging with the boss 10.

With the above-described configuration, the heat insulating member can be easily attached to the image display device.

In the image display device 1, 1A, 1B, 1C, 1D, 1E, 1F, or 1G according to a ninth aspect of the present disclosure, based on the first aspect, the heat insulating member 5, 5D, 5E, or 5F may be disposed at a position including the circuit board 4 when viewed in a direction perpendicular to the back surface 8 of the display panel 2.

With the above-described configuration, the heat insulating member can suitably block heat radiated from the circuit board.

In the image display device 1F or 1G according to a tenth aspect of the present disclosure, based on the first aspect, a thickness of the inner plate 3F or 3G may partially change.

With the above-described configuration, heat transferred from the circuit board to the back chassis through the boss can be equalized.

In the image display device 1F according to an eleventh aspect of the present disclosure, based on the tenth aspect, the inner plate 3F may have a protruding portion 26 protruding from the back surface 9 of the inner plate 3F toward the circuit board 4.

With the above-described configuration, heat transferred from the circuit board through the boss is equalized by the protruding portion protruding from the back surface of the inner plate toward the circuit board.

In the image display device 1G according to a twelfth aspect of the present disclosure, based on the tenth aspect, the inner plate 3G may have an inclined portion 27 that is inclined such that the thickness decreases upward from a position corresponding to an upper end of the circuit board 4.

With the above-described configuration, heat transferred from the circuit board through the boss is equalized by the inclined portion of the inner plate inclined such that the thickness decreases upward from the position corresponding to the upper end of the circuit board.

An image display device 1H, 1I, 1J, 1K, 1L, 1M, 1N, or 1P according to a thirteenth aspect of the present disclosure includes a display panel 2 that displays an image; a circuit board 4 disposed at a side of a back surface 8 of the display panel 2, at a position corresponding to a portion of the back surface 8 of the display panel 2; and a heat insulating member 5H, 5I, 5J, 5K, 5L, 5M, 5N, or 5P provided between the circuit board 4 and the display panel 2.

With the above-described configuration, heat generated from the circuit board and directed toward the display panel is blocked by the heat insulating member provided between the circuit board and the display panel. Accordingly, a local temperature increase of the display panel is suppressed.

Consequently, an image display device that can make a temperature distribution of the back surface of the display panel close to being uniform can be provided.

The image display device 1H or 1I according to a fourteenth aspect of the present disclosure, based on the thirteenth aspect, may further include a back chassis 6H formed at the back surface 8 of the display panel 2, in a flat shape with respect to the back surface 8, and the heat insulating member 5H or 5I may be disposed between the back chassis 6H and the circuit board 4H.

With the above-described configuration, the heat insulating member is disposed between the back chassis formed at the back surface of the display panel, in the flat shape with respect to the back surface, and the circuit board disposed at the position corresponding to the portion of the back surface of the display panel. Accordingly, heat generated from the circuit board and directed toward the display panel is blocked by the heat insulating member.

The image display device 1H according to a fifteenth aspect of the present disclosure, based on the fourteenth aspect, may further include a tray chassis 28 provided at a side of the back chassis 6H opposite to the display panel 2, and the heat insulating member 5H may be disposed between the tray chassis 28 and the circuit board 4H.

With the above-described configuration, the heat insulating member is disposed between the tray chassis provided at the side of the back chassis opposite to the display panel, and the circuit board disposed at the position corresponding to the portion of the back surface of the display panel. Accordingly, heat generated from the circuit board and directed toward the display panel is blocked by the heat insulating member.

The image display device 1H according to a sixteenth aspect of the present disclosure, based on the fourteenth aspect, may further include a tray chassis 28 provided at a side of the back chassis 6H opposite to the display panel 2, and the heat insulating member 5I may be disposed between the back chassis 6H and the tray chassis 28.

With the above-described configuration, the heat insulating member is disposed between the back chassis formed at the back surface of the display panel, in the flat shape with respect to the back surface, and the tray chassis provided at the side of the back chassis opposite to the display panel. Accordingly, heat generated from the circuit board and directed toward the display panel is blocked by the heat insulating member.

In the image display device 1I according to a seventeenth aspect of the present disclosure, based on the fourteenth aspect, the circuit board 4H may include a first sub-board (a power supply board 29), a second sub-board (a ICON board 30), and a third sub-board (a main board 31), and the heat insulating member 5J1, 5J2, or 5J3 may be formed to overlap at least two of the first sub-board (the power supply board 29), the second sub-board (the ICON board 30), and the third sub-board (the main board 31) when viewed in a direction perpendicular to the back chassis 6H.

With the above-described configuration, image sticking of the display panel at an intermediate position among the first sub-board, the second sub-board, and the third sub-board can be avoided.

In the image display device 1J according to an eighteenth aspect of the present disclosure, based on the seventeenth aspect, the first sub-board may be a power supply board 29, the second sub-board may be a ICON board 30, the third sub-board may be a main board 31, and the heat insulating member 5J1, 5J2, or 5J3 may be formed to overlap the power supply board 29, the ICON board 30, and the main board 31.

With the above-described configuration, image sticking of the display panel at an intermediate position among the power supply board, the ICON board, and the main board can be avoided.

In the image display device 1L according to a nineteenth aspect of the present disclosure, based on the thirteen aspect, the heat insulating member 5L may be formed to cover the circuit board 4.

With the above-described configuration, heat generated from the circuit board can be released from a surface of the circuit board opposite to the display panel. Accordingly, conduction of heat released from the circuit board to the display panel can be avoided.

In the image display device 1M according to a twentieth aspect of the present disclosure, based on the thirteen aspect, the heat insulating member 5M may have a surface facing the circuit board 4 and formed in an uneven shape.

With the above-described configuration, air can circulate through gaps between the circuit board and the heat insulating member. Accordingly, heat generated at the circuit board can be released with air.

Additional Notes

In the image display device 1K according to another aspect of the present disclosure, based on the thirteenth aspect, the heat insulating member 5K may have electrically insulating properties.

With the above-described configuration, a leakage of electricity from the circuit board can be avoided by the electrically insulating properties of the heat insulating member.

In the image display device 1N according to still another aspect of the present disclosure, based on the thirteenth aspect, the heat insulating member 5N may be formed to decrease in thickness as being away from the circuit board 4 in a direction parallel to the display panel 2.

With the above-described configuration, when heat released from the circuit board is insulated by the heat insulating member, heat conduction at a position at which the circuit board overlaps the display panel is suppressed, and heat mostly released from the circuit board can be suppressed.

In the image display device 1P according to yet another aspect of the present disclosure, based on the thirteenth aspect, the heat insulating member 5P may be disposed in a posture inclined with respect to the circuit board 4.

With the above-described configuration, when heat released from the circuit board is insulated, heat conduction at a position at which the circuit board overlaps the display panel is suppressed. By changing the inclination of the heat insulating member, a heat distribution at the position overlapping the circuit board can be adjusted.

The present disclosure is not limited to the above-described embodiments, and various modifications are possible within the scope of the claims. Embodiments obtained by appropriately combining technical measures disclosed in different embodiments are also included in the technical scope of the present disclosure. Further, new technical features can be formed by combining the technical measures disclosed in the respective embodiments.

The present disclosure contains subject matter related to that disclosed in Japanese Priority Patent Application JP 2020-204879 filed in the Japan Patent Office on Dec. 10, 2020 and Japanese Priority Patent Application JP 2021-

182706 filed in the Japan Patent Office on Nov. 9, 2021, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. An image display device comprising:
a display panel that displays an image;
an inner plate provided at a side of a back surface of the display panel;
a circuit board disposed at a position corresponding to a portion of the back surface of the display panel at a side of a back surface of the inner plate;
a heat insulating member provided between the circuit board and the inner plate; and
a back chassis that supports the display panel,
wherein the back chassis is provided between the inner plate and the heat insulating member,
wherein the back chassis is provided with a boss for installing the circuit board, and the heat insulating member is attached to be engaged with the boss, and
wherein the heat insulating member has a notch for engaging with the boss.

2. The image display device according to claim 1, wherein the heat insulating member is disposed at a position including the circuit board when viewed in a direction perpendicular to the back surface of the display panel.

3. An image display device, comprising:
a display panel that displays an image;
an inner plate provided at a side of a back surface of the display panel;
a circuit board disposed at a position corresponding to a portion of the back surface of the display panel at a side of a back surface of the inner plate; and
a heat insulating member provided between the circuit board and the inner plate, wherein a thickness of the inner plate partially changes.

4. The image display device according to claim 3, wherein the inner plate has a protruding portion protruding from the back surface of the inner plate toward the circuit board.

5. The image display device according to claim 3, wherein the inner plate has an inclined portion that is inclined such that the thickness decreases upward from a position corresponding to an upper end of the circuit board.

6. An image display device comprising:
a display panel that displays an image;
a circuit board disposed at a side of a back surface of the display panel, at a position corresponding to a portion of the back surface of the display panel;
a heat insulating member provided between the circuit board and the display panel;
a back chassis formed at the back surface of the display panel, in a flat shape with respect to the back surface; and
a tray chassis provided at a side of the back chassis opposite to the display panel, wherein the heat insulating member is disposed between the tray chassis and the circuit board.

* * * * *